(12) United States Patent
Choi et al.

(10) Patent No.: US 11,133,354 B2
(45) Date of Patent: Sep. 28, 2021

(54) LIGHT-EMITTING DISPLAY DEVICE

(71) Applicant: LG DISPLAY CO., LTD., Seoul (KR)

(72) Inventors: Howon Choi, Paju-si (KR); Jonggeun Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 45 days.

(21) Appl. No.: 16/201,648

(22) Filed: Nov. 27, 2018

(65) Prior Publication Data
US 2019/0165055 A1    May 30, 2019

(30) Foreign Application Priority Data
Nov. 29, 2017 (KR) .................. 10-2017-0161451

(51) Int. Cl.
*H01L 27/32* (2006.01)
*H01L 51/52* (2006.01)
*G09G 3/3275* (2016.01)
*G09G 3/3225* (2016.01)
*G09G 3/3233* (2016.01)
*G09G 3/3266* (2016.01)
*G09G 3/3291* (2016.01)

(52) U.S. Cl.
CPC ......... *H01L 27/322* (2013.01); *G09G 3/3225* (2013.01); *G09G 3/3233* (2013.01); *G09G 3/3275* (2013.01); *H01L 51/5218* (2013.01); *H01L 51/5253* (2013.01); *H01L 51/5281* (2013.01); *G09G 3/3266* (2013.01); *G09G 3/3291* (2013.01); *G09G 2300/0819* (2013.01); *G09G 2300/0842* (2013.01); *G09G 2310/0251* (2013.01); *G09G 2310/0262* (2013.01); *G09G 2310/08* (2013.01); *H01L 27/3211* (2013.01); *H01L 27/3213* (2013.01); *H01L 27/3246* (2013.01); *H01L 51/5284* (2013.01)

(58) Field of Classification Search
CPC ............... H01L 27/322; H01L 27/3206; H01L 27/3211–3218; H01L 51/5218; H01L 51/5284; H01L 51/5281; H01L 27/3246; H01L 51/5265; H01L 51/5206–5012
See application file for complete search history.

(56) References Cited

U.S. PATENT DOCUMENTS

| 2012/0098414 | A1* | 4/2012 | Nakamura | G02B 5/201 313/504 |
| 2014/0110735 | A1* | 4/2014 | Sato | H01L 51/5228 257/98 |
| 2014/0167005 | A1* | 6/2014 | Kim | H01L 27/322 257/40 |

(Continued)

FOREIGN PATENT DOCUMENTS

| JP | 9-274991 A | 10/1997 |
| KR | 10-2015-0077875 A | 7/2015 |

(Continued)

*Primary Examiner* — Yu Chen
(74) *Attorney, Agent, or Firm* — Birch, Stewart, Kolasch & Birch, LLP (57) ABSTRACT

A light-emitting display device is provided. The light-emitting display device includes a display panel and sub-pixels. The subpixels are positioned in a display area of the display panel. At least one of the subpixels includes a color filter disposed between two electrode layers, and at least another one of the subpixels includes a color filter disposed on a protection layer on the two electrode layers.

17 Claims, 9 Drawing Sheets

(56) References Cited

U.S. PATENT DOCUMENTS

| | | | |
|---|---|---|---|
| 2015/0155525 A1* | 6/2015 | Sato | H01L 51/5271 |
| | | | 257/40 |
| 2015/0318447 A1 | 11/2015 | Choi | |
| 2016/0035795 A1* | 2/2016 | Lim | H01L 27/322 |
| | | | 257/40 |
| 2016/0079311 A1 | 3/2016 | Lim et al. | |
| 2016/0225828 A1* | 8/2016 | Lee | H01L 51/5231 |
| 2016/0365390 A1* | 12/2016 | Hsu | H01L 27/3211 |
| 2017/0025482 A1* | 1/2017 | Choi | H01L 51/5281 |
| 2018/0130971 A1* | 5/2018 | Asozu | H01L 27/322 |

FOREIGN PATENT DOCUMENTS

| | | |
|---|---|---|
| KR | 10-2015-0129551 A | 11/2015 |
| KR | 10-2017-0012664 A | 2/2017 |
| KR | 10-2017-0062904 A | 6/2017 |

* cited by examiner

| Classification | Structure | Cross section | Reflectivity(%) |
|---|---|---|---|
| 1 | Bare Glass | GLS | 8.93 |
| 2 | POL | POL | 5.43 |
| 3 | BM/Glass | GLS / BM | 7.25 |
| 4 | Glass/BM | BM / GLS | 10.79 |
| 5 | CF/Glass | GLS/CFR, GLS/CFG, GLS/CFB | 7.37/ 7.75/ 6.49 (Ave:7.2) |

Fig. 11

| Structure | Cross-sectional view | Transmissivity (%) | Luminance | Reflectivity (%) |
|---|---|---|---|---|
| Experimental example | FIG. 4 | POL 43 | 100 nits x 0.43 = 43 nits | 5.43 |
| First embodiment | FIG. 7 | RGB CF Average 90% | R : 16.7 nits + (16.7nits x 0.9 x 0.9) = 30.2nits<br>G : 16.7 nits + (16.7nits x 0.9 x 0.9) = 30.2nits<br>B : 33.3 nits x 0.9 = 29.9 nits<br>Total : 90.3 nits | 5.8 |
| Second embodiment | FIG. 9 | | R : 16.7 nits + (16.7nits x 0.9 x 0.9) = 30.2nits<br>G : 16.7 nits + (16.7nits x 0.9 x 0.9) = 30.2nits<br>B : 33.3 nits x 0.9 = 29.9 nits<br>Total : 90.3 nits | 5.8 |

LIGHT-EMITTING DISPLAY DEVICE

This application claims the priority benefit of Korean Patent Application No. 10-2017-0161451, filed in the Republic of Korea on Nov. 29, 2017, which is incorporated herein by reference for all purposes as if fully set forth herein.

BACKGROUND OF THE INVENTION

Field of the Invention

The present invention relates to a light-emitting display device.

Related Art

With the development of information technology, markets for display devices serving as connecting media between users and information are growing. Accordingly, display devices such as an organic light-emitting diode (OLED) display, a liquid crystal display (LCD) and a plasma display panel (PDP) are increasingly used.

Among the aforementioned display devices, the OLED display device includes a display panel including a plurality of subpixels, a driver for driving the display panel and a power supply for supplying power to the display panel. The driver includes a scan driver for supplying scan signals (or gate signals) to the display panel and a data driver for supplying data signals to the display panel.

OLED display devices display images in such a manner that light-emitting diodes of selected subpixels emit light when scan signals and data signals are supplied to subpixels arranged in a matrix. OLED display devices are classified into a bottom emission type which emits light toward a lower substrate and a top emission type which emits light toward an upper substrate.

OLED display devices have various advantages because they display images on the basis of light generated from LEDs included in subpixels and thus are spotlighted as future display device. However, to realize ultra-high definition OLED display devices, more research needs to be conducted.

SUMMARY OF THE INVENTION

Embodiments of the present invention provide a liquid-emitting display device, which addresses the limitations and disadvantages associated with the related art.

The present invention provides a light-emitting display device including a display panel and subpixels. The subpixels are positioned in a display area of the display panel. At least one of the subpixels includes a color filter disposed between two electrode layers, and at least another one of the subpixels includes a color filter disposed on a protection layer on the two electrode layers.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DESCRIPTION OF EMBODIMENTS

Reference will now be made in detail embodiments of the invention examples of which are illustrated in the accompanying drawings.

A display device described below according to the embodiments of the present invention is applicable to any spontaneous emission type display device based on spontaneous emission type elements capable of emitting light. Particularly, the display device described below is applicable to inorganic light emitting display device realized on the basis of an inorganic LED as well as organic light emitting display device realized on the basis of an OLED. However, an organic light emitting display device is exemplified in the following description. Further, all the components of the display device according to all embodiments of the present invention are operatively coupled and configured.

Figure 1:
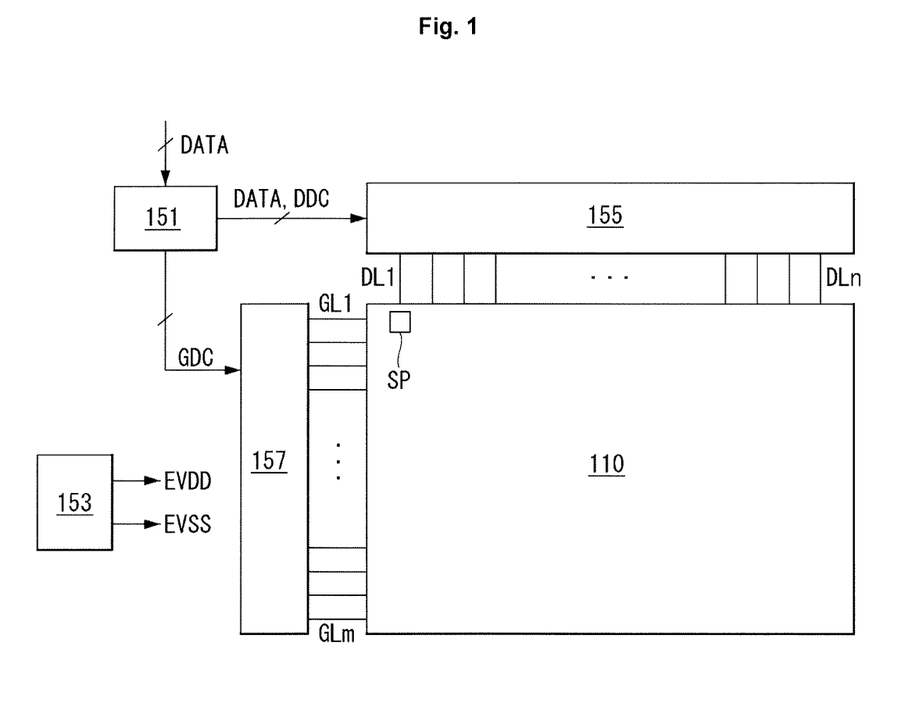
FIG. 1 is a schematic block diagram of an organic light emitting display device according to an embodiment of the present invention.
Figure 2:
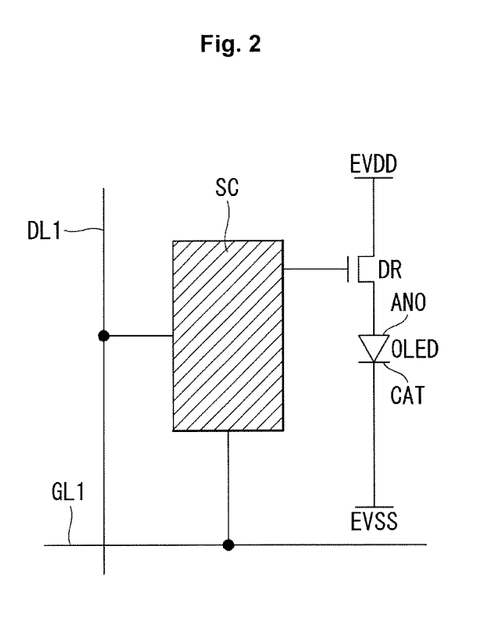
FIG. 2 is a schematic circuit diagram of a subpixel according to an example of the present invention.
Figure 3:
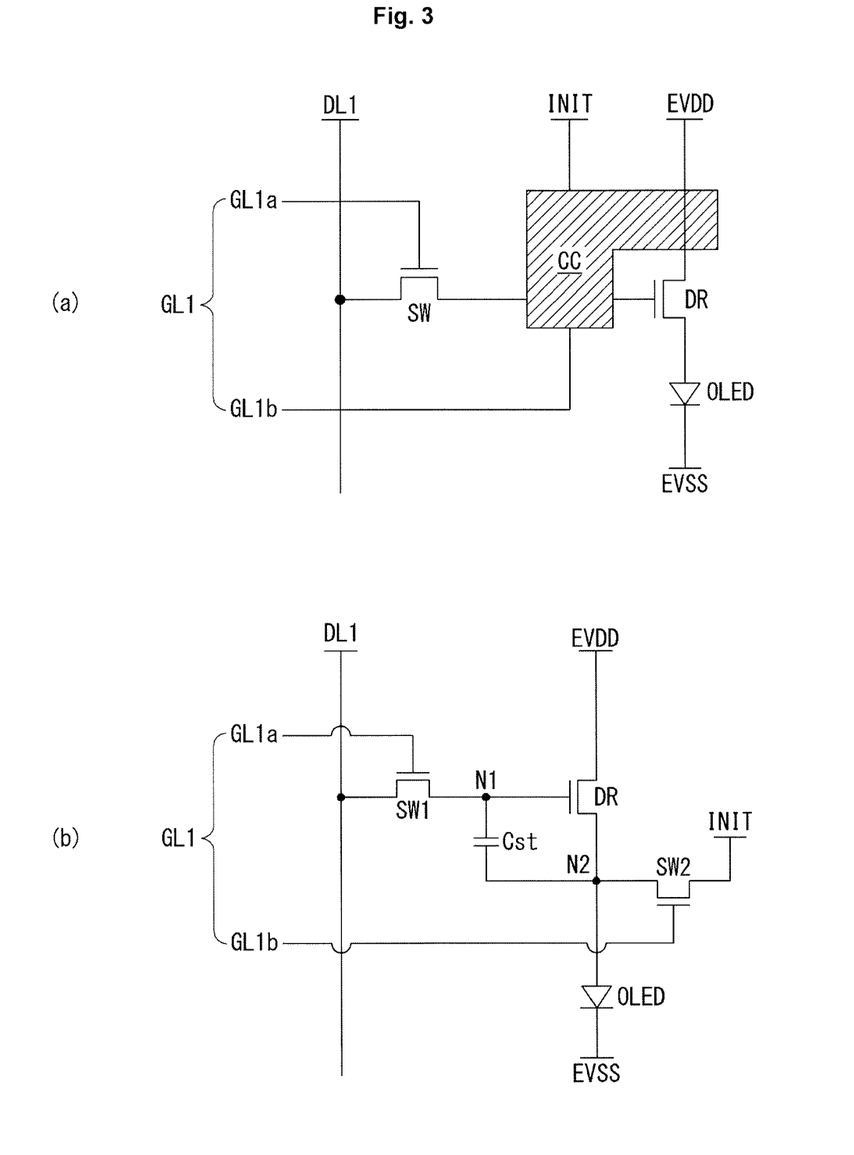
FIG. 3 is circuit diagrams showing part of FIG. 2 in detail.

FIG. 1 is a schematic block diagram of an organic light emitting display device according to an embodiment of the present invention, FIG. 2 is a schematic circuit diagram of a subpixel according to an example of the present invention and FIG. 3 is circuit diagrams showing part of FIG. 2 in detail.

As shown in FIG. 1, the organic light emitting display device includes a timing controller 151, a data driver 155, a scan driver 157, a display panel 110 and a power supply 153.

The timing controller 151 receives driving signals including a data enable signal, a vertical synchronization signal, a horizontal synchronization signal and a clock signal along with a data signal DATA from an image processor. The timing controller 151 outputs a gate timing control signal GDC for controlling operation timing of the scan driver 157 and a data timing control signal DDC for controlling operation timing of the data driver 155 on the basis of the driving signals. The timing controller 151 can be configured in the form of an integrated circuit(IC).

The data driver 155 samples and latches the data signal DATA supplied from the timing controller 151 in response to the data timing control signal DDC supplied from the timing controller 151 to convert the digital data signal into an analog data signal (or data voltage) using a gamma reference voltage and outputs the analog data signal. The data driver 155 outputs the data signal DATA through data lines DL1 to DLn. The data driver 155 can be configured in the form of an IC.

The scan driver 157 outputs a scan signal in response to the gate timing control signal GDC supplied from the timing controller 151. The scan driver 157 outputs the scan signal through scan lines GL1 to GLm. The scan driver 157 is configured in the form of an IC or formed according to gate in panel (a method of forming a transistor through a thin film forming process) in the display panel 110.

The power supply 153 outputs a high voltage and a low voltage. The high voltage and the low voltage output from the power supply 153 are supplied to the display panel 110. The high voltage is supplied to the display panel 110 through a first power line EVDD and the low voltage is supplied to the display panel through a second power line EVSS. The power supply 153 can be configured in the form of an IC.

The display panel 110 displays an image on the basis of the data signal DATA supplied from the data driver 155, the scan signal supplied from the scan driver 157 and power supplied from the power supply 153. The display panel 110 includes subpixels SP which operate to display images and emit light.

The display panel 110 is divided into a bottom emission type which emits light downward from a transistor array, a top emission type which emits light upward from the transistor array and a dual emission type which emits light upward and downward.

The subpixels SP include red, green and blue subpixels or white, red, green and blue pixels. The subpixels SP can have one or more emission areas according to emission characteristics.

As shown in FIG. 2, a single subpixel includes a programming unit SC for setting a gate-source voltage of a driving transistor DR and an organic LED (OLED) which are positioned at an intersection of a data line DL1 and a scan line GL1. Each of the subpixels in the display panel 110 of FIG. 1 can be equated to the subpixel of FIG. 2.

The OLED includes an anode ANO, a cathode CAT and an organic emission layer interposed between the anode ANO and the cathode CAT. The anode ANO is connected to the driving transistor DR.

The programming unit SC can be realized by a transistor array including at least one switching transistor and at least one capacitor. The transistor array is realized on the basis of a CMOS semiconductor, a PMOS transistor or an NMOS transistor. Transistors included in the transistor array can be p-type or n-type transistors. Further, semiconductor layers of the transistors included in the transistor array of the subpixel can include amorphous silicon, polysilicon or oxide.

The switching transistor is turned on in response to a scan signal from the scan line GL1 to apply a data voltage from the data line DL1 to one electrode of the capacitor. The driving transistor DL adjusts the emission quantity of the OLED by controlling the quantity of current according to the voltage charged in the capacitor. The emission quantity of the OLED is proportional to the quantity of current supplied from the driving transistor DR. Further, the subpixel is connected to the first power line EVDD and the second power line EVSS and provided with the high voltage and the low voltage therethrough.

As shown in (a) of FIG. 3, the subpixel can include an internal compensation circuit CC in addition to the aforementioned switching transistor SW, the driving transistor DR, the capacitor and the OLED. The internal compensation circuit CC can include one or more transistors connected to a compensation signal line INIT. The internal compensation circuit CC sets a gate-source voltage of the driving transistor DR to a voltage in which the threshold voltage of the driving transistor DR has been reflected to prevent luminance variation due to the threshold voltage of the driving transistor DR when the OLED emits light. In this case, the scan line GL1 includes at least two scan lines GL1a and GL1b for controlling the switching transistor SW and transistors of the internal compensation circuit CC.

As shown in (b) of FIG. 3, the subpixel can include a switching transistor SW1, a driving transistor DR, a sensing transistor SW2, a capacitor Cst and an OLED. The sensing transistor SW2 can be included in the compensation circuit CC and performs a sensing operation for compensation operation of the subpixel.

The switching transistor SW1 serves to provide a data voltage supplied through the data line DL1 to a first node N1 in response to a scan signal supplied through the first scan line GL1a. In addition, the sensing transistor SW2 initializes or senses a second node N2 positioned between the driving transistor DR and the OLED in response to a sensing signal supplied through the second sensing line GL1b.

The subpixel circuit configurations illustrated in FIG. 3 are merely for aiding in understanding the present invention. That is, the subpixel circuit of the present invention is not limited thereto and can be configured in various configurations such as 2T1C (2-transistor 1-capacitor), 3T1C, 4T2C, 6T2C and 7T2C.

Experimental Example

Figure 4:
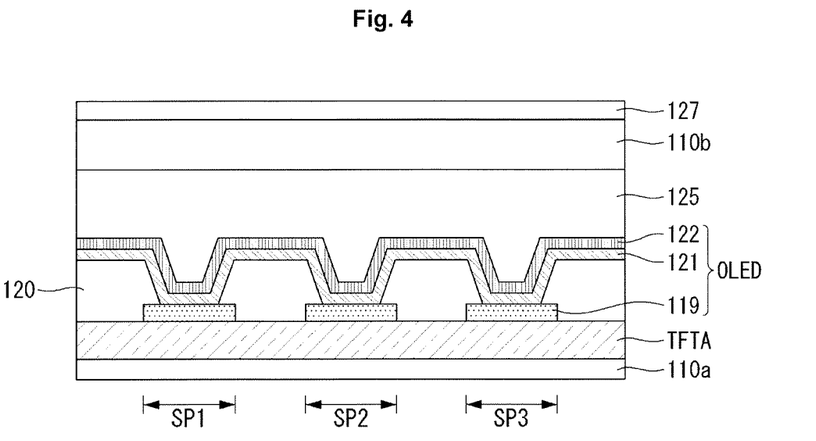
FIG. 4 is a cross-sectional view showing part of a display area of a display panel according to an experimental example.

FIG. 4 is a cross-sectional view showing part of a display area of a display panel according to an experimental example.

As shown in FIG. 4, the display panel according to the experimental example includes a first substrate 110a, a transistor array TFTA, organic light-emitting diodes (OLEDs), a resin layer 125, a second substrate 110b and a polarization film 127.

The transistor array TFTA is positioned on the first substrate 110a. The transistor array TFTA includes switching transistors, capacitors and driving transistors. The OLEDs are positioned on the transistor array TFTA. The OLEDs include a first electrode layer 119 connected to the source or drain electrodes of the driving transistors, an emission layer 121 and a second electrode layer 122. The resin layer 125 is positioned on the first substrate 110a and covers the OLEDs and the transistor array TFTA. The second substrate 110b is positioned on the resin layer 125.

First to third subpixels SP1 to SP3 included in the display panel are defined by a bank layer 120. The first to third subpixels SP1 to SP3 include elements included in the transistor array TFTA and the OLEDs.

The experimental example is a top emission type display panel which emits light generated from the OLEDs upward from the transistor array TFTA, that is, the second substrate 110b. In the experimental example, the polarization film 127 is disposed on the second substrate 110b in order to reduce reflectivity of the display panel due to external light. The polarization film 127 can be provided by being attached or coated on the surface of the second substrate 110b.

First Embodiment

Figure 5:
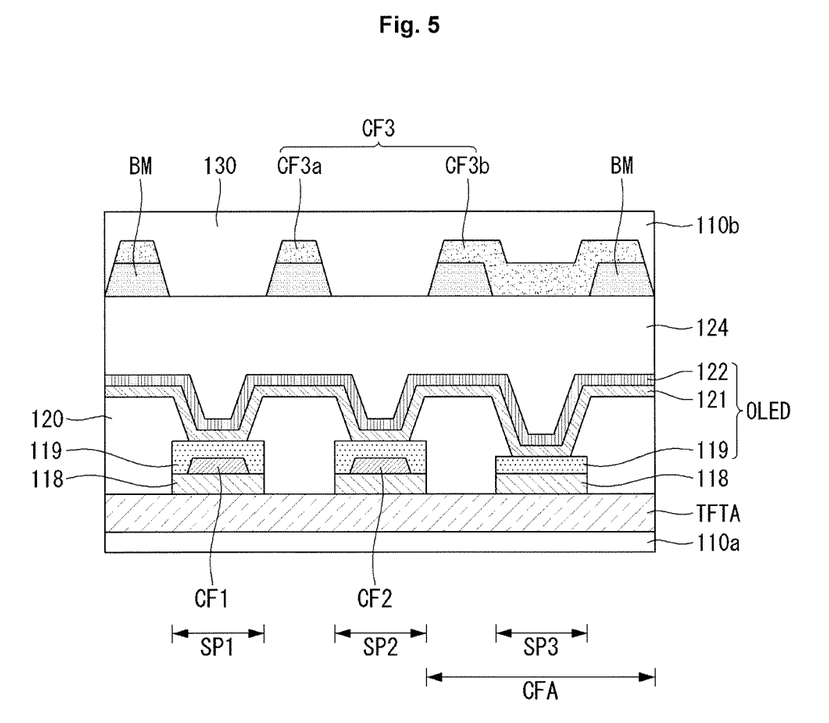
FIG. 5 is a cross-sectional view showing part of a display area of a display panel according to a first embodiment of the present invention.
Figure 6:
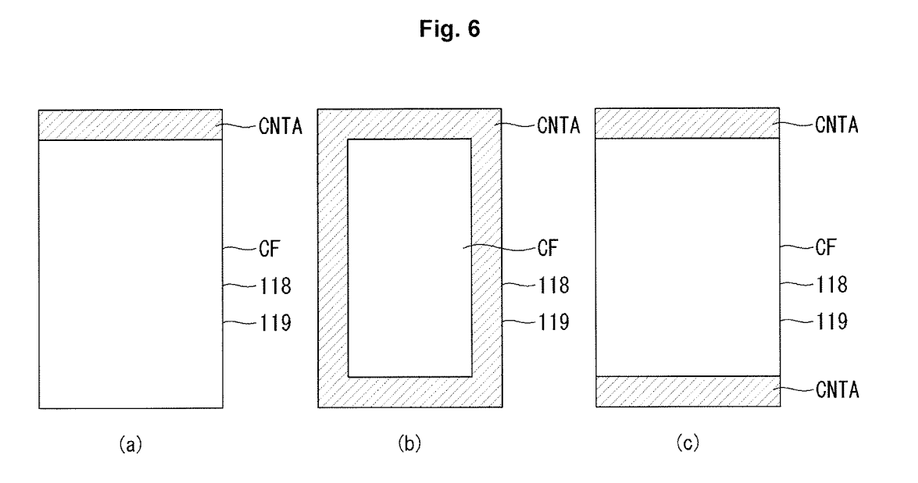
FIG. 6 is a plan view of a reflective electrode layer, a color filter layer and a first electrode layer laminated on the display panel of FIG. 5.
Figure 7:
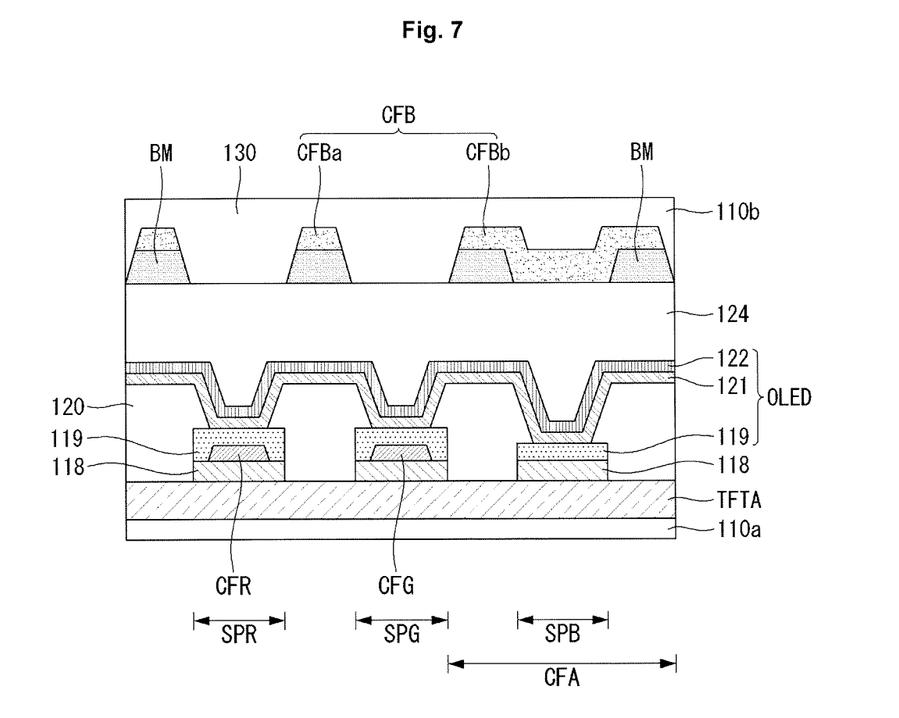
FIG. 7 illustrates a display panel realized according to the first embodiment of the present invention.

FIG. 5 is a cross-sectional view showing part of the display area of the display panel according to the first embodiment of the present invention, FIG. 6 is a plan view of a reflective electrode layer, a color filter layer and a first electrode layer laminated on the display panel of FIG. 5 and FIG. 7 illustrates a display panel realized according to the first embodiment of the present invention.

As shown in FIG. 5, the display panel according to the first embodiment of the present invention includes a first substrate 110a, a transistor array TFTA, OLEDs, a protection layer 124, black matrix layers BM, color filters CF1, CF2 and CF3, and a second substrate 110b.

At least one of the first substrate 110a and the second substrate 110b can be formed of a material through which light can pass, such as glass, silicon, plastic or resin. The transistor array TFTA is positioned on the first substrate 110a. The transistor array TFTA includes switching transistors, capacitors and driving transistors.

The OLEDs are positioned on the transistor arrays TFTA. The OLEDs include a reflective electrode layer 118, a first electrode layer 119, an emission layer 121 and a second electrode layer 122. One of the reflective electrode layer 118 and the first electrode layer is directly connected to the source or drain electrodes of the driving transistors included in the transistor array TFTA.

The reflective electrode layer 118 can be formed of a metallic material having reflectivity, such as Ag or Al. The first electrode layer 119 and the second electrode layer 122 serve as an anode and a cathode (or vice versa). The emission layer 121 has at least one emission layer. The emission layer 121 can generate white light, red light, green light or blue light. The emission layer 121 can generate light of a specific color according to a combination of different colors generated by the first and second emission layers.

The protection layer 124 is positioned on the OLEDs. The protection layer 124 serves to protect the OLEDs and the transistor array TFTA from moisture or oxygen. The protection layer 124 is positioned on the first substrate 110a and covers the OLEDs and the transistor array TFTA. The protection layer 124 is formed in a monolayer or multilayer structure. The protection layer 124 has a flat surface. When the protection layer 124 is formed in a multilayer structure, the protection layer 124 can have a structure in which an organic material and an inorganic material are alternatively laminated. The protection layer 124 can be defined as an encapsulation layer formed on the first substrate 110a to encapsulate the OLEDs and the transistor array TFTA.

First to third subpixels SP1 to SP3 included in the display panel are defined by a bank layer 120. The bank layer 120 is positioned on the transistor array TFTA and includes openings selectively exposing the first electrode layer 119. The openings of the bank layer 120 define the subpixel regions and emission areas. The first to third subpixels SP1 to SP3 include elements included in the transistor array TFTA and the OLEDs and are defined by the bank layer 120.

The black matrix layers BM are positioned on the protection layer 124. The black matrix layers BM contain a black pigment for blocking penetration of light. The black matrix layers BM are separated corresponding to the bank layer 120 on the first substrate 110a. Regions in which the black matrix layers BM are positioned are defined as non-emission areas in which light is not emitted and regions in which the black matrix layers BM are not positioned are defined as emission areas in which light is emitted.

In the first embodiment, the color filters CF1, CF2 and CF3 are used to eliminate a polarization film positioned on the display panel, and at least two of the color filters CF1, CF2 and CF3 are disposed at different levels. A structure for achieving this will be described below.

The first subpixel SP1 includes the first color filter CF1 disposed between the reflective electrode layer 118 and the first electrode layer 119. That is, the first subpixel SP1 includes a layer which causes color change under the emission layer 121. Color change occurs in the first subpixel SP1 on the basis of the first color filter CF1 disposed between the two electrode layers 118 and 119. Light generated from the emission layer 121 of the first subpixel SP1 is emitted through a path described below and changed to a first color.

Part of the light generated from the emission layer 121 (light emitted from the upper part of the emission layer) passes through the second electrode layer 122, the protection layer 124 and the second substrate 110b to be projected into the air. The remaining part of the light generated from the emission layer 121 (light emitted from the lower part of the emission layer) passes through the first electrode layer 119 and the first color filter CF1 and then is reflected by the reflective electrode layer 118, passes through the first color filter CF1 again and sequentially passes through all the layers on the first color filter CF1 to be projected into the air. That is, part of the light generated from the emission layer 121 of the first subpixel SP1 passes through the first color filter CF1 at least twice.

The second subpixel SP2 includes the second color filter CF2 disposed between the reflective electrode layer 118 and the first electrode layer 119. That is, the second subpixel SP1 includes a layer which causes color change under the emission layer 121. Color change occurs in the second subpixel SP2 on the basis of the second color filter CF2 disposed between the two electrode layers 118 and 119. Light generated from the emission layer 121 of the second subpixel SP2 is emitted through a path described below and changed to a second color.

Part of the light generated from the emission layer 121 passes through the second electrode layer 122, the protection layer 124 and the second substrate 110b to be projected into the air. The remaining part of the light generated from the emission layer 121 passes through the first electrode layer 119 and the second color filter CF2 and then is reflected by the reflective electrode layer 118, passes through the second color filter CF2 again and sequentially passes through all the layers on the second color filter CF2 to be projected into the air. That is, part of the light generated from the emission layer 121 of the second subpixel SP2 passes through the second color filter CF2 at least twice.

The third subpixel SP3 includes the third color filter CF3 disposed on the protection layer 124. That is, the third subpixel SP3 does not include a layer which causes color change under the emission layer 121. The third color filter CF3 includes a third-first color filter CF3a and a third-second color filter CF3b.

The third-first color filter CF3a can cover the entirety or part of the surface of the black matrix layer BM disposed on the protection layer 124 of neighboring subpixels. The third-second color filter CF3b covers spaces between the black matrix layers BM disposed on the protection layer 124 of the third subpixel SP3. The third-second color filter CF3b can cover the sides and surfaces of the black matrix layers BM separated at both sides of the protection layer 124 of the third subpixel SP3. In such a case, the area CFA occupied by the third-second color filter CF3b is larger than the area occupied by the third subpixel SP. This is merely an example and the third color filter CF3 can be positioned between the black matrix layers BM disposed on the protection layer 124 of the third subpixel SP3.

Color change occurs in the third subpixel SP3 on the basis of the third color filter CF3 disposed on the protection layer 124. Light generated from the emission layer 121 of the third subpixel SP3 is emitted through a path described below and changed to a third color.

Part of the light generated from the emission layer 121 passes through the second electrode layer 122, the protection layer 124, the third color filter CF3 and the second substrate 110b to be projected into the air. The remaining part of the light generated from the emission layer 121 passes through the first electrode layer 119 and then is reflected by the reflective electrode layer 118, passes through the first electrode layer 119 again and sequentially passes through all the layers on the first electrode layer 119 to be projected into the air. That is, part of the light generated from the emission layer 121 of the third subpixel SP3 passes through the third color filter CF3 at least once.

As described above, in the first and second subpixels SP1 and SP2, light generated from the emission layer 121 passes through the first and second color filters CF1 and CF2 at least twice according to the reflective electrode layer 118 to be changed to the first color and the second color. On the contrary, in the third subpixel SP3, light generated from the emission layer 121 passes through the third color filter CF3 at least once to be changed to the third color even if reflected by the reflective electrode layer 118.

Driving current (or driving voltage) for driving the OLEDs is applied through the reflective electrode layer 118 or the first electrode layer 119 connected to the source or drain electrodes of driving transistors. The first and second color filters CF1 and CF2 can be formed of a material having conductivity and capable of causing color change. However, when the color filter layer is formed of a nonconductive or nonmetallic material, the first and second color filters CF1 and CF2 can be formed of a material which generates resistance between the two electrode layers 118 and 119.

On the other hand, when both the reflective electrode layer 118 and the first electrode layer 119 are connected to the source or drain electrodes of the driving transistors, even if the first and second color filters CF1 and CF2 are disposed between the reflective electrode layer 118 and the first electrode layer 119, problems such as increase in contact resistance do not occur. However, when one of the reflective electrode layer 118 and the first electrode layer 119 is connected to the source or drain electrodes of the driving transistors (particularly, when the first electrode layer is connected to the source or drain electrodes through the reflective electrode layer), it is desirable to dispose the first and second color filters CF1 and CF2 as shown in FIG. 6.

Although the following description is based on the first subpixel SP1, the same applies to the second subpixel SP2. Further, although it is assumed that the reflective electrode layer 118 and the first electrode layer 119 have the same size, this is exemplary and they can have different sizes.

As shown in (a) of FIG. 6, the first color filter CF1 can be disposed between the reflective electrode layer 118 and the first electrode layer 119 having a contact area CNTA where the reflective electrode layer 118 and the first electrode layer 119 contact each other at one side thereof. The first electrode layer 119 covers the first color filter CF1 and contacts one side of the reflective electrode layer 118.

As shown in (b) of FIG. 6, the first color filter CF1 can be disposed between the reflective electrode layer 118 and the first electrode layer 119 having a contact area CNTA where the reflective electrode layer 118 and the first electrode layer 119 contact each other through the entire edges thereof. The first electrode layer 119 covers the first color filter CF1 and contacts the entire edges of the reflective electrode layer 118. That is, the first color filter CF1 is encapsulated by the reflective electrode layer 118 and the first electrode layer 119.

As shown in (c) of FIG. 6, the first color filter CF1 can be disposed between the reflective electrode layer 118 and the first electrode layer 119 having a contact area CNTA where the reflective electrode layer 118 and the first electrode layer 119 contact each other at both sides thereof. The first electrode layer 119 covers the first color filter CF1 and contacts both sides of the reflective electrode layer 118.

As in the examples of FIG. 6, since the first color filter CF1 is disposed between the reflective electrode layer 118 and the first electrode layer 119, it is desirable that the first color filter CF1 be smaller than the two electrode layers 118 and 119. However, when both the reflective electrode layer 118 and the first electrode layer 119 are electrically connected, the size of the first color filter CF1 can correspond to or be larger than the two electrode layers 118 and 119.

Hereinafter, a display panel structure realized in consideration of characteristics of the emission layer and the color filter layer on the basis of the first embodiment of the present invention will be described focusing on specific parts with respect to FIG. 6.

As shown in FIG. 7, a red subpixel SPR and a green subpixel SPG have the same structure whereas a blue subpixel SPB has a different structure from the red subpixel SPR and the green subpixel SPG.

The emission layer 121 of the red subpixel SPR emits red light, the emission layer 121 of the green subpixel SPG emits green light and the emission layer 121 of the blue subpixel SPB emits blue light.

The red subpixel SPR and the green subpixel SPG respectively include a red color filter CFR and a green color filter CFG interposed between the two electrode layers 118 and 119, whereas the blue subpixel SPB includes a blue color filter CFB disposed on the protection layer 124 instead of being interposed between the two electrode layers 118 and 119.

Light directly emitted from the red subpixel SPR, the green subpixel SPG and the blue subpixel SPB through the emission layer 121 and light reflected by the reflective electrode layer 118 and projected are combined. Accordingly, light generated from the emission layer of each subpixel needs to have the same color as the color of the color filter disposed in each subpixel. Further, the red subpixel SPR, the green subpixel SPG and the blue subpixel SPB need to be disposed corresponding to emission areas although they are disposed at different positions.

The blue color filter CFB includes a first blue color filter CFBa which covers the surface of the black matrix layer BM positioned corresponding to the bank layer defining the red subpixel SPR and the green subpixel SPG and a second blue color filter CFBb which covers the surfaces and sides of the black matrix layers BM positioned corresponding to the bank layer defining the blue subpixel SPB and the emission area thereof.

The first blue color filter CFBa is positioned on the surface of the black matrix layer BM positioned corresponding to the bank layer defining the red subpixel SPR and the green subpixel SPG. The reflectivity of the black matrix layer BM is further reduced according to the first blue color filter CFBa covering the black matrix layer BM because the first blue color filter CFBa has lower reflectivity than the black matrix layer BM. In addition, in the red subpixel SPR and the green subpixel SPG, non-emission areas are covered by the blue color filter instead of the red color filter and the green color filter included in the red subpixel SPR and the green subpixel SPG, and thus a possibility of occurrence of color mixing between subpixels is also reduced.

On the basis of test results described below, the red, green and blue color filters CFR, CFG and CFB are separately disposed between the electrode layers 118 and 119 and on the protection layer 124 positioned in the emission areas while the emission layers 121 included in the red, green and blue subpixels SPR, SPG and SPB respectively emit red light, green light and blue light, as in the structure shown in FIG. 7.

Penetration characteristics and reflection characteristics of the red, green and blue color filters CFR, CFG and CFB were tested using the red, green and blue color filters CFR, CFG and CFB. According to test results, the red, green and blue color filters CFR, CFG and CFB have as low reflectivity as that of a polarization film while having penetration characteristics superior to the polarization film. That is, the implementation example of the first embodiment is based on reflection capability of the red, green and blue color filters CFR, CFG and CFB in addition to color change capability thereof.

According to implementation of the first embodiment, it is possible to decrease the reflectivity of the display panel to a level obtained when a polarization film is attached to the display panel by using a structure in which the color filters are separately disposed in the subpixels emitting red light, green light and blue light. In addition, according to implementation of the first embodiment, reflectivity can be decreased using color filters instead of a polarization film and thus luminance can be increased and manufacturing costs can be reduced because the polarization film can be eliminated. Furthermore, according to implementation of the first embodiment, it is possible to realize a flexible organic light-emitting display device because a thin display panel can be achieved due to elimination of the polarization film. Moreover, according to implementation of the first embodiment, the blue color filter instead of the red and green color filters covers non-emission areas and thus a possibility of occurrence of color mixing between subpixels can be reduced.

Figure 10:
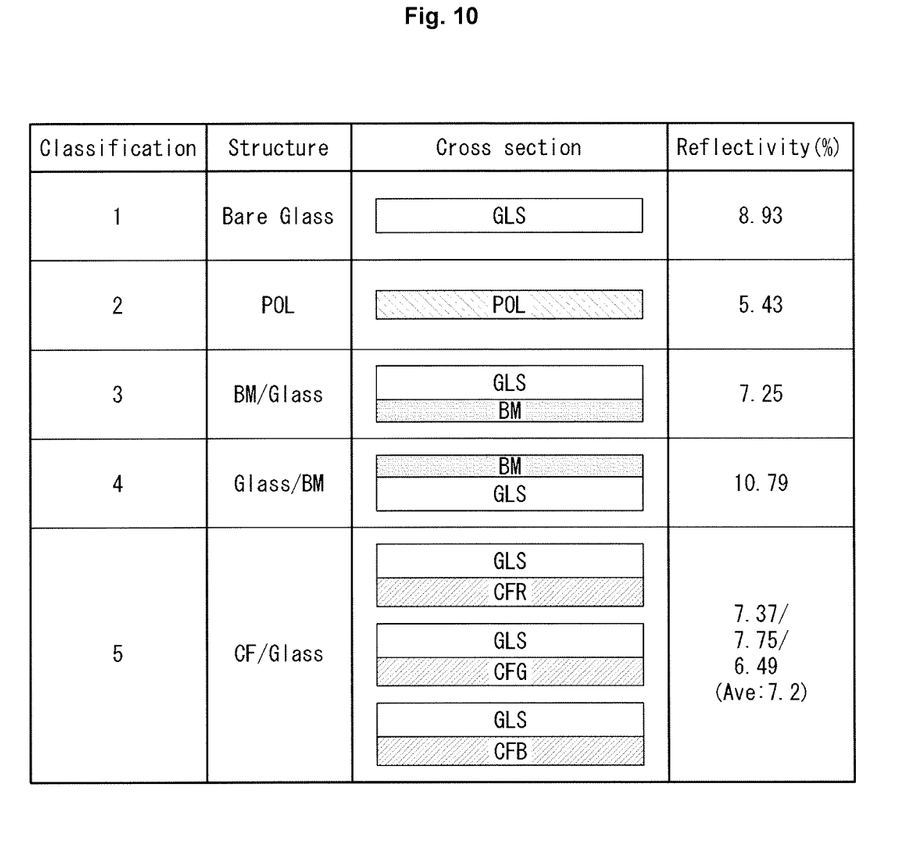
FIG. 10 shows reflectivity text results for display panel configurations.
Figure 11:
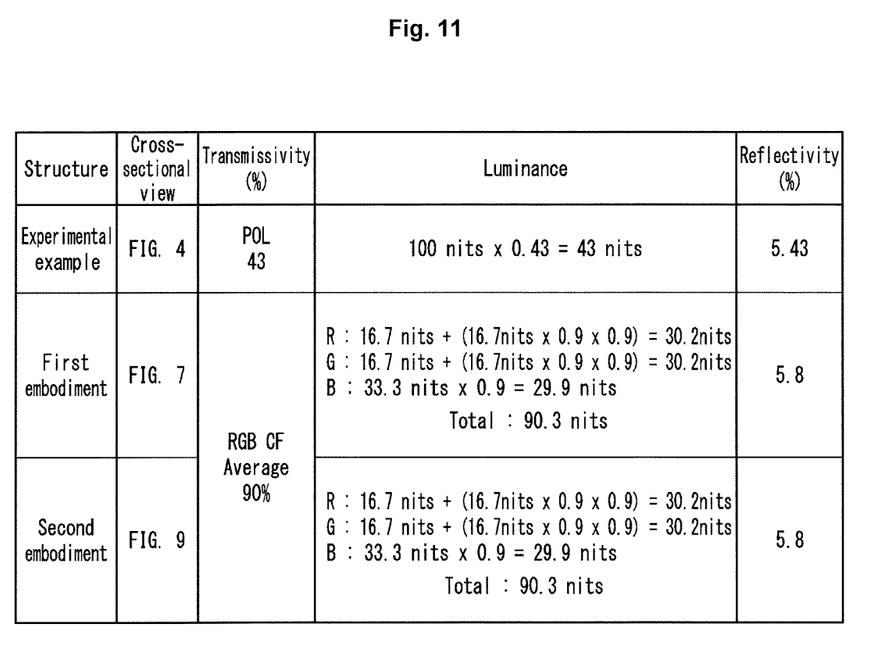
FIG. 11 shows simulation results obtained from tests of reflectivity based on FIGS. 7 and 9.

Simulation results and effects obtained when the red subpixel SPR and the green subpixel SPF are realized in the same structure and the blue subpixel SPB is realized in a different structure as in the implementation example of the first embodiment will be apparent from FIGS. 10 and 11.

Second Embodiment

Figure 8:
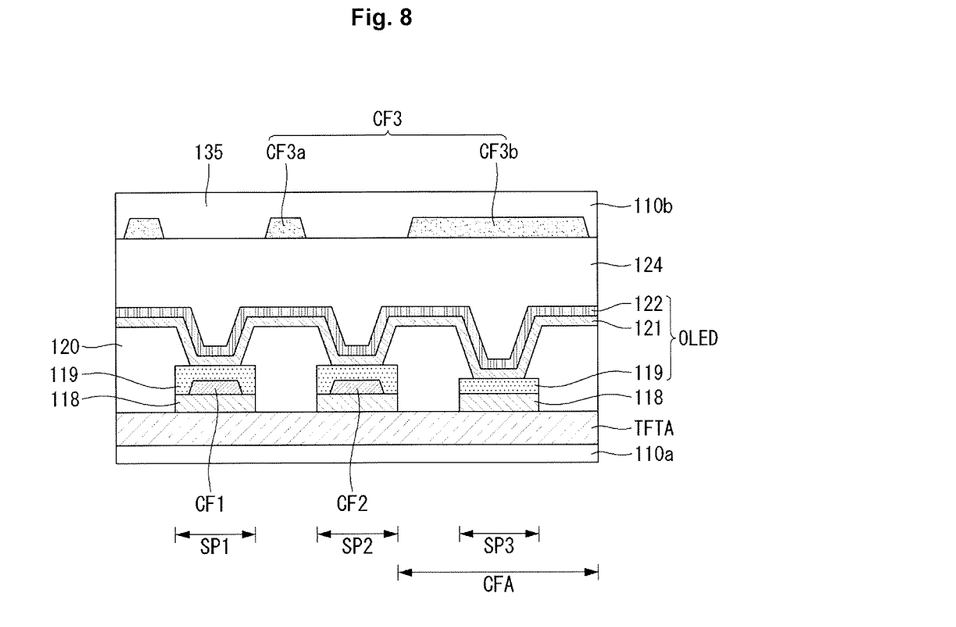
FIG. 8 is a cross-sectional view showing part of a display area of a display panel according to a second embodiment of the present invention.
Figure 9:
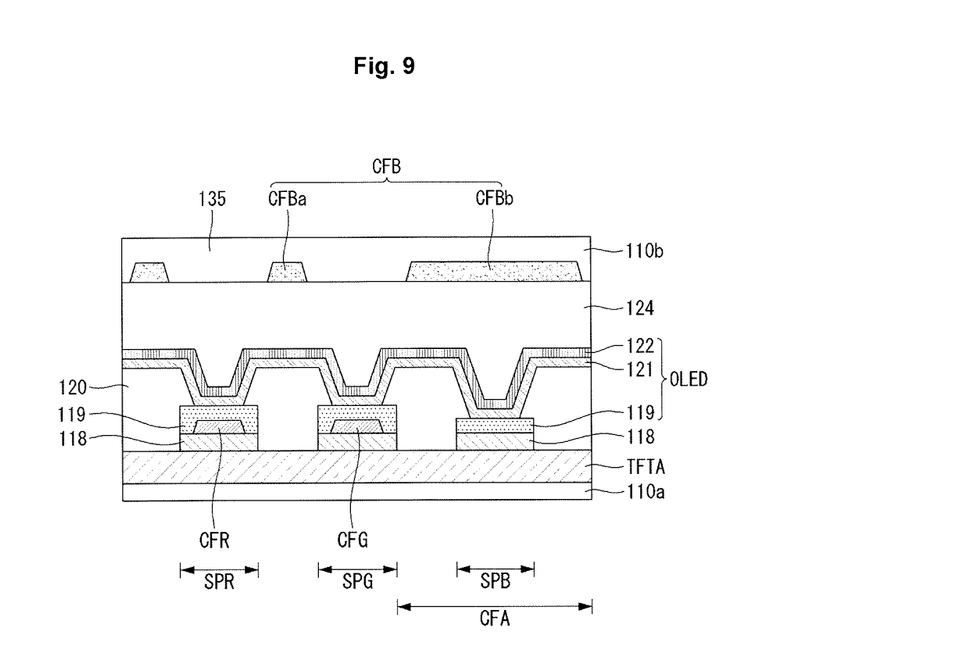
FIG. 9 illustrates a display panel realized according to the second embodiment of the present invention.

FIG. 8 is a cross-sectional view showing part of the display area of the display panel according to a second embodiment of the present invention and FIG. 9 illustrates a display panel realized according to the second embodiment of the present invention.

As shown in FIG. 8, the display panel according to the second embodiment of the present invention includes a first substrate 110a, a transistor array TFTA, OLEDs, a protection layer 124, color filters CF1, CF2 and CF3, and a second substrate 110b.

At least one of the first substrate 110a and the second substrate 110b can be formed of a material through which light can pass, such as glass, silicon, plastic or resin. The transistor array TFTA is positioned on the first substrate 110a. The transistor array TFTA includes switching transistors, capacitors and driving transistors.

The OLEDs are positioned on the transistor arrays TFTA. The OLEDs include a reflective electrode layer 118, a first electrode layer 119, an emission layer 121 and a second electrode layer 122. One of the reflective electrode layer 118 and the first electrode layer is directly connected to the source or drain electrodes of the driving transistors included in the transistor array TFTA.

The reflective electrode layer 118 can be formed of a metallic material having reflectivity, such as Ag or Al. The first electrode layer 119 and the second electrode layer 122 serve as an anode and a cathode (or vice versa). The emission layer 121 has at least one emission layer. The emission layer 121 can generate white light, red light, green light or blue light. The emission layer 121 can generate light of a specific color according to a combination of different colors generated by the first and second emission layers.

The protection layer 124 is positioned on the OLEDs. The protection layer 124 has a flat surface. The protection layer 124 serves to protect the OLEDs and the transistor array TFTA from moisture or oxygen. The protection layer 124 is positioned on the first substrate 110a and covers the OLEDs and the transistor array TFTA. The protection layer 124 is formed in a monolayer or multilayer structure. When the protection layer 124 is formed in a multilayer structure, the protection layer 124 can have a structure in which an organic material and an inorganic material are alternatively laminated. The protection layer 124 can be defined as an encapsulation layer formed on the first substrate 110a to encapsulate the OLEDs and the transistor array TFTA.

First to third subpixels SP1 to SP3 included in the display panel are defined by a bank layer 120. The bank layer 120 is positioned on the transistor array TFTA and includes openings selectively exposing the first electrode layer 119. The openings of the bank layer 120 define the subpixel regions and emission areas. The first to third subpixels SP1 to SP3 include elements included in the transistor array TFTA and the OLEDs and are defined by the bank layer 120.

The third color filter CF3 is positioned on the protection layer 124. The third color filter CF3 includes a third-first color filter CF3a and a third-second color filter CF3b. The third-first color filter CF3a is isolated and disposed corresponding to the bank layer 120 on the first substrate 110a. The third-second color filter CF3b is disposed corresponding to the emission area of the third subpixel SP3. The third-second color filter CF3b can extend to both sides of the protection layer 124 to cover the bank layer 120 disposed on both sides of the third subpixel SP3. In such a case, the area CFA occupied by the third-second color filter CF3b is larger than the area occupied by the third subpixel SP3. However, this is exemplary and the third color filter CF3 can be disposed on the protection layer 124 to correspond to only the emission area of the third subpixel SP3.

In the second embodiment, the color filters CF1, CF2 and CF3 are used to eliminate a polarization film positioned on the display panel, and at least two of the color filters CF1, CF2 and CF3 are disposed at different levels. A structure for achieving this will be described below.

The first subpixel SP1 includes the first color filter CF1 disposed between the reflective electrode layer 118 and the first electrode layer 119. That is, the first subpixel SP1 includes a layer which causes color change under the emission layer 121. Color change occurs in the first subpixel SP1 on the basis of the first color filter CF1 disposed between the two electrode layers 118 and 119. Light generated from the emission layer 121 of the first subpixel SP1 is emitted through a path described below and changed to a first color.

Part of light generated from the emission layer 121 (light emitted from the upper part of the emission layer) passes through the second electrode layer 122, the protection layer 124 and the second substrate 110*b* to be projected into the air. The remaining part of the light generated from the emission layer 121 (light emitted from the lower part of the emission layer) passes through the first electrode layer 119 and the first color filter CF1 and then is reflected by the reflective electrode layer 118, passes through the first color filter CF1 again and sequentially passes through all the layers on the first color filter CF1 to be projected into the air. That is, part of the light generated from the emission layer 121 of the first subpixel SP1 passes through the first color filter CF1 at least twice.

The second subpixel SP2 includes the second color filter CF2 disposed between the reflective electrode layer 118 and the first electrode layer 119. That is, the second subpixel SP1 includes a layer which causes color change under the emission layer 121. Color change occurs in the second subpixel SP2 on the basis of the second color filter CF2 disposed between the two electrode layers 118 and 119. Light generated from the emission layer 121 of the second subpixel SP2 is emitted through a path described below and changed to a second color.

Part of the light generated from the emission layer 121 passes through the second electrode layer 122, the protection layer 124 and the second substrate 110*b* to be projected into the air. The remaining part of the light generated from the emission layer 121 passes through the first electrode layer 119 and the second color filter CF2 and then is reflected by the reflective electrode layer 118, passes through the second color filter CF2 again and sequentially passes through all the layers on the second color filter CF2 to be projected into the air. That is, part of the light generated from the emission layer 121 of the second subpixel SP2 passes through the second color filter CF2 at least twice.

The third subpixel SP3 includes the third color filter CF3 disposed on the protection layer 124. That is, the third subpixel SP3 does not include a layer which causes color change under the emission layer 121. Color change occurs in the third subpixel SP3 on the basis of the third color filter CF3 disposed on the protection layer 124. Light generated from the emission layer 121 of the third subpixel SP3 is emitted through a path described below and changed to a third color.

Part of the light generated from the emission layer 121 passes through the second electrode layer 122, the protection layer 124, the third color filter CF3 and the second substrate 110*b* to be projected into the air. The remaining part of the light generated from the emission layer 121 passes through the first electrode layer 119 and then is reflected by the reflective electrode layer 118, passes through the first electrode layer 119 again and sequentially passes through all the layers on the first electrode layer 119 to be projected into the air. That is, part of the light generated from the emission layer 121 of the third subpixel SP3 passes through the third color filter CF3 at least once.

As described above, in the first and second subpixels SP1 and SP2, light generated from the emission layer 121 passes through the first and second color filters CF1 and CF2 at least twice according to the reflective electrode layer 118 to be changed to the first color and the second color. On the contrary, in the third subpixel SP3, light generated from the emission layer 121 passes through the third color filter CF3 at least once to be changed to the third color even if reflected by the reflective electrode layer 118.

Driving current (or driving voltage) for driving the OLEDs is applied through the reflective electrode layer 118 or the first electrode layer 119 connected to the source or drain electrodes of driving transistors. The first and second color filters CF1 and CF2 can be formed of a material having conductivity and capable of causing color change. However, when the color filter layer is formed of a nonconductive or nonmetallic material, the first and second color filters CF1 and CF2 can be formed of a material which generates resistance between the two electrode layers 118 and 119.

On the other hand, when both the reflective electrode layer 118 and the first electrode layer 119 are connected to the source or drain electrodes of the driving transistors, even if the first and second color filters CF1 and CF2 are disposed between the reflective electrode layer 118 and the first electrode layer 119, problems such as increase in contact resistance do not occur. However, when one of the reflective electrode layer 118 and the first electrode layer 119 is connected to the source or drain electrodes of the driving transistors (particularly, when the first electrode layer is connected to the source or drain electrodes through the reflective electrode layer), it is desirable to dispose the first and second color filters CF1 and CF2 according to the structure of FIG. 6 described in the first embodiment. However, the present invention is not limited thereto.

Hereinafter, a display panel structure realized in consideration of characteristics of the emission layer and the color filter layer on the basis of the second embodiment of the present invention will be described focusing on specific parts with respect to FIG. 9.

As shown in FIG. 9, a red subpixel SPR and a green subpixel SPG have the same structure whereas a blue subpixel SPB has a different structure from the red subpixel SPR and the green subpixel SPG.

The emission layer 121 of the red subpixel SPR emits red light, the emission layer 121 of the green subpixel SPG emits green light and the emission layer 121 of the blue subpixel SPB emits blue light.

The red subpixel SPR and the green subpixel SPG respectively include a red color filter CFR and a green color filter CFG interposed between the two electrode layers 118 and 119, whereas the blue subpixel SPB includes a blue color filter CFB disposed on the protection layer 124 instead of being interposed between the two electrode layers 118 and 119.

The blue color filter CFB includes a first blue color filter CFBa positioned corresponding to the bank layer defining the red subpixel SPR and the green subpixel SPG and a second blue color filter CFBb positioned corresponding to the bank layer defining the blue subpixel SPB and the emission area thereof.

Light directly emitted from the red subpixel SPR, the green subpixel SPG and the blue subpixel SPB through the emission layer 121 and light reflected by the reflective electrode layer 118 and projected are combined. Accordingly, light generated from the emission layer of each subpixel needs to have the same color as the color of the color filter disposed in each subpixel. Further, the red subpixel SPR, the green subpixel SPG and the blue subpixel SPB need to be disposed corresponding to emission areas although they are disposed at different positions.

On the basis of test results described below, the red, green and blue color filters CFR, CFG and CFB are separately disposed between the electrode layers 118 and 119 and on the protection layer 124 positioned in the emission areas while the emission layers 121 included in the red, green and blue subpixels SPR, SPG and SPB respectively emit red light, green light and blue light, as in the structure shown in FIG. 9.

Penetration characteristics and reflection characteristics of the red, green and blue color filters CFR, CFG and CFB were tested using the red, green and blue color filters CFR, CFG and CFB. According to test results, the red, green and blue color filters CFR, CFG and CFB have as low reflectivity as that of a polarization film while having penetration characteristics superior to the polarization film. That is, the implementation example of the second embodiment is based on reflection capability of the red, green and blue color filters CFR, CFG and CFB in addition to color change capability thereof.

According to implementation of the second embodiment, it is possible to decrease the reflectivity of the display panel to a level obtained when a polarization film is attached to the display panel by using a structure in which the color filters are separately disposed in the subpixels emitting red light, green light and blue light. In addition, according to implementation of the second embodiment, reflectivity can be decreased using color filters instead of a polarization film and thus luminance can be increased and manufacturing costs can be reduced because the polarization film can be eliminated. Furthermore, according to implementation of the second embodiment, it is possible to realize a flexible organic light-emitting display device because a thin display panel can be achieved due to elimination of the polarization film.

Simulation results and effects obtained when the red subpixel SPR and the green subpixel SPF are realized in the same structure and the blue subpixel SPB is realized in a different structure as in the implementation example of the second embodiment will be apparent from FIGS. 10 and 11.

FIG. 10 shows reflectivity text results for display panel configurations and FIG. 11 shows simulation results obtained from tests of reflectivity based on FIGS. 7 and 9.

Referring to FIG. 10, a glass substrate GLS has reflectivity (%) of 8.93, a polarization film POL has reflectivity (%) of 5.43, a structure in which a black matrix layer BM and a glass substrate GLS are sequentially laminated has reflectivity (%) of 7.25, and a structure in which a glass substrate GLS and a black matrix layer BM are sequentially laminated has reflectivity (%) of 10.79.

In addition, a structure in which a red color filter CFR and a glass substrate GLS are sequentially laminated has reflectivity (%) of 7.37, a structure in which a green color filter CFG and a glass substrate GLS are sequentially laminated has reflectivity (%) of 7.75, a structure in which a blue color filter CFB and a glass substrate GLS are sequentially laminated has reflectivity (%) of 6.49, and the average reflectivity (%) thereof is 7.2.

According to the reflectivity test results for display panel configurations, the blue color filter CFB has the lowest reflectivity among the red, green and blue color filters CFR, CFG and CFB.

As shown in FIG. 11, the structures illustrated in FIGS. 7 and 9 according to the first and second embodiments of the present invention are examples applied to a display panel on the basis of the fact that the blue color filter CFB has the lowest reflectivity from the test results of FIG. 10. FIG. 11 shows results of simulations of reflectivity characteristics of the structures shown in FIGS. 7 and 9 according to the first and second embodiments compared with the experimental example of FIG. 4 in order to evaluate the structures of FIGS. 7 and 9.

With respect to the experimental example, a simulation result when the display panel has transmissivity of 43% due to a polarization film attached thereto and luminance of 100 nits was obtained. According to the simulation result, the display panel of the experimental result has reflectivity (%) of 5.43.

With respect to the first embodiment, a simulation result when a display panel formed in the structure shown in FIG. 7 has transmissivity of 90% which is the average of transmissivities of red, green and blue color filters and luminance of 90.3 nits was obtained. With respect to the second embodiment, a simulation result when a display panel formed in the structure shown in FIG. 9 has transmissivity of 90% which is the average of transmissivities of red, green and blue color filters and luminance of 90.3 nits was obtained. According to the simulation results, both the display panels of the first and second embodiments have reflectivity (%) of 5.8.

As can be known from the simulation results, the first and second embodiments obtain luminance improved more than twice that of the experimental example according to transmissivity increase due to elimination of the polarization film while achieving reflectivity equivalent to that of a structure including the polarization film such as the experimental example. That is, the first and second embodiments can minimize loss of light generated from the emission layer.

As described above, the first and second embodiments can achieve reflectivity, which is equivalent to that obtained using a polarization film, without a polarization film and minimize loss of light and thus can provide a high-efficiency and low-reflectance organic light-emitting display device.

Meanwhile, the reason why the red and green subpixels R and G have different luminance from the blue subpixel B in the first and second embodiments is described below.

Light generated from the emission layers of the red and green subpixels R and G has the same luminance of 33.3 nits as light generated from the emission layer of the blue subpixels B. However, light generated from the emission layers of the red and green subpixels R and G are projected downward and upward, as described above. Here, light projected downward passes through the color filter layer at least twice due to the influence of the reflective electrode layer. Light generated from the emission layers of the blue subpixel B is projected downward and upward. Here, light projected upward and downward passes through the color filter layer only once even if affected by the reflective electrode layer.

As a result, the red and green subpixels R and G have luminance of 16.7 nits (amount corresponding to light emitted from the upper part of the emission layers)+(16.7 nits×0.9×0.9)(amount corresponding to light emitted from the lower part of the emission layers× amount corresponding to light that has passed through the color filter layer twice) =30.2 nits, and the blue subpixel B has luminance of 33.3 nits (amount corresponding to light emitted from the upper and lower parts)×0.9(amount corresponding to light that has passed through the color filter layer once).

According to the test results, the reflectivity of the blue color filter CFB was lower than the surface reflectivity of the black matrix layer BM. That is, BM> CFB.

When a display panel is manufactured, the characteristic that the blue color filter CFB has lower reflectivity than the black matrix layer BM can be used. Representative examples are illustrated in FIGS. 7 and 9. When the blue color filter CFB covers the surface of the black matrix layer BM, as shown in FIGS. 7 and 9, reflectivity of the display panel can be further reduced to obtain the advantage of a low reflectance structure.

However, the structures according to the first and second embodiments can be modified into a structure according to a third embodiment described below. In the third embodiment, only parts modified from the structures according to the first and second embodiments will be described.

Third Embodiment

Figure 12:
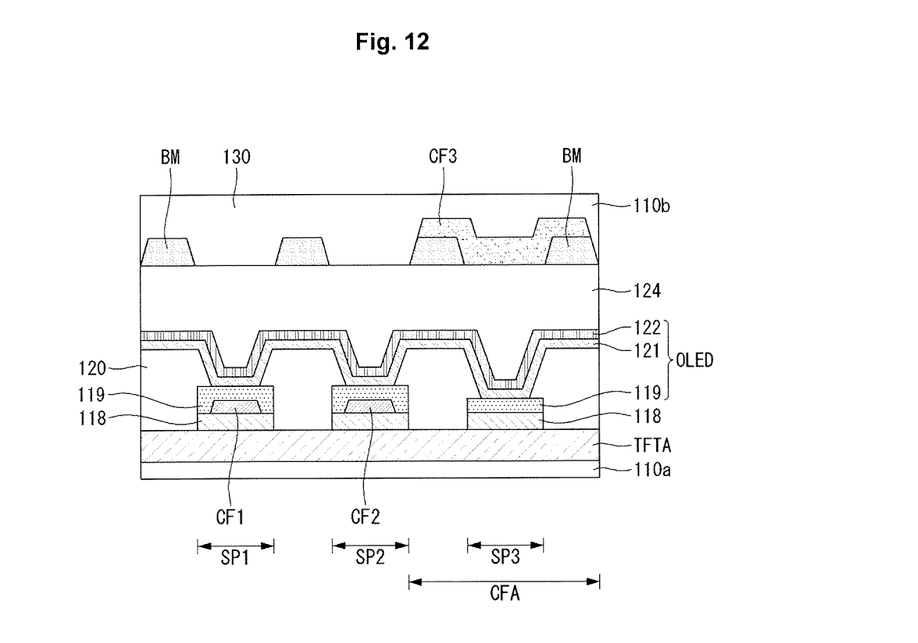
FIGS. 12 and 13 are cross-sectional views showing part of a display area of a display panel according to a third embodiment of the present invention.
Figure 13:
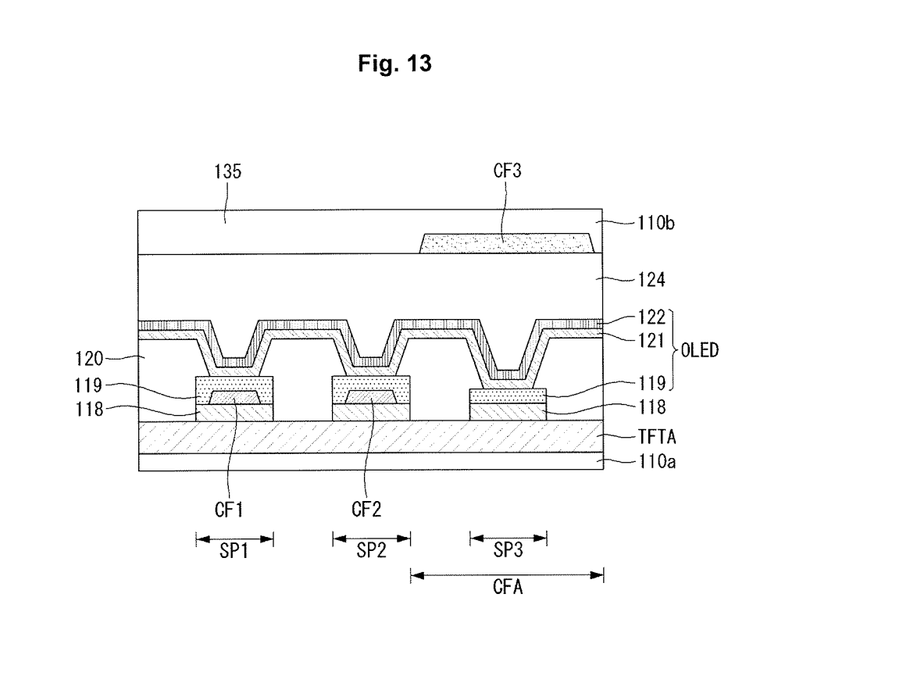

FIGS. 12 and 13 are cross-sectional views showing a part of a display area of a display panel according to the third embodiment of the present invention.

As shown in FIGS. 12 and 13, the third color filter CF3 can be disposed only on the protection layer 124 corresponding to the third subpixel SP3 according to the third embodiment. The third color filter CF3 can be disposed corresponding to the emission areas or the bank layer 120 and the emission areas.

When the black matrix layers BM are positioned on the protection layer 124, as shown in FIG. 12, the third color filter CF3 can cover the sides and the surfaces of black matrix layers BM separated at both sides of the protection layer 124 of the third subpixel SP3. However, the present invention is not limited thereto.

The above-described first to third embodiments are exemplary and thus one or more thereof can be appropriately combined according to material characteristics of a display panel to be modified.

As described above, the embodiment(s) of the present invention can decrease reflectivity of the display panel to a level equivalent to that obtained when a polarization film is employed while eliminating the polarization film and minimize loss of light and thus can provide a high-efficiency low-reflectance organic light-emitting display device. In addition, the embodiment(s) of the present invention can easily realize a flexible organic light-emitting display device by eliminating the polarization film. Furthermore, the embodiment(s) of the present invention can reduce manufacturing costs by eliminating the polarization film. Moreover, the embodiment(s) of the present invention can prevent color mixing between subpixels using the color filter layer.

What is claimed is:

1. A light-emitting display device comprising:
a display panel;
subpixels positioned in a display area of the display panel, wherein at least one of the subpixels includes a color filter of a color disposed between two electrode layers and not disposed on a protection layer on the two electrode layers, and at least another one of the subpixels includes a color filter of another color disposed on the protection layer on the two electrode layers and not disposed between the two electrode layers; and
a second substrate disposed on the protection layer and the color filter of another color disposed on the protection layer,
wherein the second substrate directly contacts the protection layer in the at least one of the subpixels,
wherein the subpixels include red, green and blue subpixels,
wherein the red subpixel includes a red color filter disposed between the two electrode layers, the green subpixel includes a green color filter disposed between the two electrode layers, and the blue subpixel includes a blue color filter disposed on the protection layer on the two electrode layers,
wherein the protection layer covers a light-emitting diode, and
wherein the blue color filter includes:
a first blue color filter disposed to correspond to a bank layer defining emission areas of the red and green subpixels, and
a second blue color filter disposed to correspond to an emission area of the blue subpixel and a bank layer defining the emission area of the blue subpixel.

2. The light-emitting display device according to claim 1, wherein the two electrode layers include:
a reflective electrode layer positioned on a first substrate of the display panel, and
a first electrode layer positioned on the reflective electrode layer.

3. The light-emitting display device according to claim 2, wherein the reflective electrode layer and the first electrode layer electrically contact each other at one side or both sides thereof.

4. The light-emitting display device according to claim 2, wherein the reflective electrode layer and the first electrode layer electrically contact each other at the entire edges thereof.

5. The light-emitting display device according to claim 2, wherein the color filter disposed between the two electrode layers has a size corresponding to or smaller than the first electrode layer.

6. The light-emitting display device according to claim 1, wherein the red subpixel includes an emission layer for emitting red light, the green subpixel includes an emission layer for emitting green light and the blue subpixel includes an emission layer for emitting blue light.

7. The light-emitting display device according to claim 1, further comprising a black matrix layer positioned between the protection layer and the first blue color filter and between the protection layer and the second blue color filter.

8. The light-emitting display device according to claim 7, wherein the first blue color filter covers a surface of the black matrix layer, and the second blue color filter covers the surface and a side of the black matrix layer.

9. The light-emitting display device according to claim 1, wherein the red color filter is disposed to correspond to the emission area of the red subpixel, the green color filter is disposed to correspond to the emission area of the green subpixel and the blue color filter is disposed to correspond to the emission area of the blue subpixel.

10. The light-emitting display device according to claim 1, wherein the protection layer is formed in a single-layer or multi-layer structure covering the subpixels and having a flat surface.

11. The light-emitting display device according to claim 1,
wherein the blue color filter is disposed on a black matrix defining the emission areas of the red and green subpixels.

12. The light-emitting display device according to claim 1, wherein in the at least one of the subpixels, no other color filter is disposed on the protection layer on the two electrode layers, and
wherein in the at least another one of the subpixels, no other color filter is disposed between the two electrode layers.

13. The light-emitting display device according to claim 1, wherein the display panel lacks a polarization film on a substrate of the display panel.

14. A light-emitting display device comprising:
a display panel;
subpixels positioned in a display area of the display panel, wherein each of the subpixels includes a color filter disposed only in between two electrode layers, or only on a protection layer on the two electrode layers, and wherein at least one subpixel of the subpixels includes the color filter disposed only in between the two electrode layers, and at least one another subpixel of the subpixels includes the color filter disposed only on the protection layer; and a second substrate disposed on the protection layer and the color filter of another color disposed on the protection layer, wherein the second substrate directly contacts the protection layer in the at least one subpixel, wherein the subpixels include red, green and blue subpixels, wherein the red subpixel includes a red color filter disposed between the two electrode layers, the green subpixel includes a green color filter disposed between the two electrode layers, and the blue subpixel includes a blue color filter disposed on the protection layer on the two electrode layers, wherein the protection layer covers a light-emitting diode, and wherein the blue color filter includes:

a first blue color filter disposed to correspond to a bank layer defining emission areas of the red and green subpixels, and a second blue color filter disposed to correspond to an emission area of the blue subpixel and a bank layer defining the emission area of the blue subpixel.

15. The light-emitting display device according to claim 14, wherein the display panel lacks a polarization film on a substrate of the display panel.

16. The light-emitting display device according to claim 14, wherein the two electrode layers include:

a reflective electrode layer positioned on a first substrate of the display panel, and a first electrode layer positioned on the reflective electrode layer.

17. The light-emitting display device according to claim 14, further comprising a black matrix layer positioned between the protection layer and the color filter disposed only on the protection layer.

* * * * *